(12) United States Patent
Braddock

(10) Patent No.: US 7,187,045 B2
(45) Date of Patent: *Mar. 6, 2007

(54) JUNCTION FIELD EFFECT METAL OXIDE COMPOUND SEMICONDUCTOR INTEGRATED TRANSISTOR DEVICES

(75) Inventor: Walter David Braddock, Rochester, MN (US)

(73) Assignee: OSEMI, Inc., Cannon Falls, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/198,705

(22) Filed: Jul. 16, 2002

(65) Prior Publication Data

US 2004/0207029 A1 Oct. 21, 2004

(51) Int. Cl.
*H01L 29/76* (2006.01)
*H01L 21/336* (2006.01)

(52) U.S. Cl. ............... 257/411; 257/410; 438/216; 438/261; 438/287

(58) Field of Classification Search ............... 257/410, 257/411, 192, 194; 438/285, 590, 216, 261, 438/421, 591, 595, 287, 954, 981
See application file for complete search history.

(56) References Cited

U.S. PATENT DOCUMENTS

| | | |
|---|---|---|
| 2,993,814 A | 7/1961 | Epprecht et al. |
| 3,950,273 A | 4/1976 | Jones ........................ 252/517 |
| 4,239,955 A | 12/1980 | Cho |
| 4,404,265 A | 9/1983 | Manasevit |
| 4,410,902 A | 10/1983 | Malik |
| 4,416,952 A | 11/1983 | Nishizawa et al. ......... 428/698 |
| 4,553,022 A | 11/1985 | Colombo |
| 4,561,915 A | 12/1985 | Mito ........................ 148/171 |
| 4,624,901 A | 11/1986 | Glass ........................ 428/469 |
| 4,671,777 A | 6/1987 | van Esdonk et al. ........ 445/51 |
| 4,685,193 A | 8/1987 | Faria et al. ................ 29/558 |
| 4,745,082 A | 5/1988 | Kwok ........................ 437/39 |
| 4,802,180 A | 1/1989 | Brandle, Jr. et al. ......... 372/41 |
| 4,810,526 A | 3/1989 | Ito et al. |
| 4,843,450 A | 6/1989 | Kirchner et al. ............. 357/52 |

(Continued)

FOREIGN PATENT DOCUMENTS

GB 2047113 A 11/1980

(Continued)

OTHER PUBLICATIONS

Passlack et al., "Thermodynamic and photochemical stability of low interface state density $Ga_2O_3$—GaAs structures fabricated by in-situ molecular beam epitaxy", Applied Physics Letters, vol. 69, No. 3, pp. 302-304, Jul. 15, 1996.

(Continued)

*Primary Examiner*—Ori Nadav
(74) *Attorney, Agent, or Firm*—Neifeld IP Law, PC

(57) ABSTRACT

A self-aligned enhancement mode metal-oxide-compound semiconductor field effect transistor includes a gate insulating structure comprised of a first conducting oxide layer comprised of indium oxide compounds positioned immediately on top of the compound semiconductor structure, and a second insulating layer comprised of either gallium oxygen and rare earth elements or gallium sulphur and rare earth elements positioned immediately on top of said first layer.

139 Claims, 3 Drawing Sheets

U.S. PATENT DOCUMENTS

| | | | |
|---|---|---|---|
| 4,859,253 A | 8/1989 | Buchanan et al. ......... 148/33.3 |
| 4,916,498 A | 4/1990 | Berenz |
| 4,935,789 A | 6/1990 | Calviello ..................... 357/22 |
| 4,970,060 A | 11/1990 | Belt et al. |
| 5,055,445 A | 10/1991 | Belt et al. ....................... 505/1 |
| 5,124,762 A | 6/1992 | Childs et al. .................. 357/16 |
| 5,170,407 A | 12/1992 | Schubert et al. |
| 5,270,798 A | 12/1993 | Pao et al. |
| 5,323,053 A | 6/1994 | Luryi et al. |
| 5,386,137 A | 1/1995 | Dell et al. |
| 5,425,043 A | 6/1995 | Holonyak et al. |
| 5,451,548 A | 9/1995 | Hunt et al. ................. 437/225 |
| 5,491,712 A | 2/1996 | Lin et al. |
| 5,550,089 A | 8/1996 | Dutta et al. ................. 437/225 |
| 5,597,768 A | 1/1997 | Passlack et al. ............ 437/236 |
| 5,640,751 A | 6/1997 | Faria ....................... 29/525.07 |
| 5,665,658 A * | 9/1997 | Passlack ..................... 438/763 |
| 5,693,565 A | 12/1997 | Camilletti et al. .......... 437/192 |
| 5,729,563 A | 3/1998 | Wang et al. |
| 5,739,557 A | 4/1998 | O'Neil et al. |
| 5,767,388 A | 6/1998 | Fleischer et al. .......... 73/31.06 |
| 5,805,624 A | 9/1998 | Yang et al. |
| 5,821,171 A | 10/1998 | Hong et al. ................. 438/767 |
| 5,838,708 A | 11/1998 | Lin et al. |
| 5,896,408 A | 4/1999 | Corzine et al. |
| 5,900,653 A | 5/1999 | Suzuki et al. |
| 5,912,498 A | 6/1999 | Hobson et al. |
| 5,930,611 A | 7/1999 | Okamoto ..................... 438/197 |
| 5,945,718 A * | 8/1999 | Passlack et al. ............ 257/410 |
| 5,953,362 A | 9/1999 | Pamulapati et al. |
| 6,006,582 A | 12/1999 | Bhandari et al. ............ 73/23.2 |
| 6,028,693 A | 2/2000 | Fork et al. |
| 6,030,453 A | 2/2000 | Passlack et al. ............ 117/104 |
| 6,045,611 A | 4/2000 | Ishii et al. |
| 6,069,908 A | 5/2000 | Yuen et al. |
| 6,071,780 A | 6/2000 | Okamoto et al. ........... 438/287 |
| 6,094,295 A | 7/2000 | Passlack et al. ............ 359/321 |
| 6,114,079 A | 9/2000 | Christian et al. ........... 430/201 |
| 6,121,153 A | 9/2000 | Kikkawa |
| 6,150,677 A | 11/2000 | Tanaka et al. ............... 257/201 |
| 6,162,300 A | 12/2000 | Bichrt |
| 6,207,976 B1 | 3/2001 | Takahashi et al. .......... 257/192 |
| 6,252,896 B1 | 6/2001 | Tan et al. |
| 6,313,511 B1 | 11/2001 | Noguchi ..................... 257/392 |
| 6,347,049 B1 | 2/2002 | Childress et al. ........... 365/173 |
| 6,347,104 B1 | 2/2002 | Dijaili et al. |
| 6,445,015 B1 | 9/2002 | Braddock |
| 6,451,711 B1 | 9/2002 | Braddock, IV |
| 6,573,528 B2 | 6/2003 | Braddock |
| 6,670,651 B1 | 12/2003 | Braddock |
| 6,936,900 B1 | 8/2005 | Braddock, IV |
| 6,989,556 B2 | 1/2006 | Braddock, IV |
| 2002/0024108 A1* | 2/2002 | Lucovsky et al. .......... 257/410 |
| 2002/0113285 A1 | 8/2002 | Braddock |
| 2003/0137018 A1 | 7/2003 | Passlack et al. |
| 2004/0205979 A1 | 10/2004 | Braddock |
| 2004/0207029 A1 | 10/2004 | Braddock |

FOREIGN PATENT DOCUMENTS

| JP | 8085873 A | 4/1998 |
|---|---|---|
| WO | WO 02/12598 | 2/2002 |
| WO | WO 02/15233 | 2/2002 |
| WO | WO 02/15283 | 2/2002 |
| WO | WO 02/15285 | 2/2002 |
| WO | WO 2005/048318 | 5/2005 |

OTHER PUBLICATIONS

Passlack et al., "Recombination velocity at oxide-GaAs interfaces fabricated by in-situ molecular beam epitaxy", Applied Physics Letters, vol. 68, No. 25, pp. 3605-3607, Jun. 17, 1997.

Passlack et al., "Quasistatic and high frequency capacitance-voltage characterization of $Ga_2O_3$—GaAs structures fabricated by in-situ molecular beam epitaxy", Applied Physics Letters, vol. 68, No. 8, pp. 1099-1101, Feb. 19, 1996.

Ueda et al., "Anisotropy of electrical and optical properties in B—$Ga_2O_3$ single crystals", Applied Physics Letters, vol. 71, No. 7, pp. 933-935, Aug. 18, 1997.

Ueda et al., "Synthesis and control of conductivity of ultraviolet transmitting B—$Ba_2O_3$ single crystals", Applied Physics Letters, vol. 70, No. 26, pp. 3561-3563, Jun. 30, 1997.

Khan et al., "AlGaN/GaN Metal Oxide Semiconductor Heterostructure Field Effect Transistor", IEEE Electron Device Letters, vol. 21, No. 2, pp. 63-65, Feb. 2000.

"1995-1996 Alfa AESAR Catalog," 1994, p. 1244, Johnson Matthey Catalog Company, Inc., Ward Hill, MA, US.

Vurgaftman et al., "Band Parameters for III-V Semiconductors and Their Alloys," J. Appl. Phys. pp. 5816-5875 (Jun. 1, 2001).

"Gallium Oxide on Gallium Arsenide: Atomic Structure, Materials, and Devices," Chapter 12, either published or scheduled for publication fin "Gallium Oxide on Gallium Arsenide: Atomic Structure, Materials, and Devices," in III-IV Semiconductor Heterostructures: Physics and Devices, edited by W.Z. Cai, Transworld Research Publisher, Kerala, India (2003).

Ueda et al., "Anisotrophy of electrical and optical properties in B—Ga2O3 single crystals", Applied Physics Letters, vol. 71, No. 7, pp. 933-935, Aug. 18, 1997.

Mar. 2004, Takebe et al., GaAs-MISFET's With Insulating Gate Films Formed by Direct Oxidation by Oxinitridation fo Recessed GaAs Surfaces.

Becke et al., "Gallium Arsenide Mos Transistors," Solid-State Electronics, Apr. 28, 1965, vol. 8, pp. 813-822, Great Britain.

Passlack et al., "C—V and G—V Characterization of In-Situ Fabricated Ga2O3—GaAs Interfaces for Inversion/Accumulation Device and Surface Passivation Applications," Solid-State Electronics, 1996, vol. 39, No. 8, pp. 1133-1136, Great Britain.

Passlack et al., "Quasistatic and High Frequency Capacitance—Voltage Characterization of Ga2O3—GaAs Structures Fabricated by in Situ Molecular Beam Epitaxy," Appl. Phys. Lett., Feb. 19, 1996, pp. 1099-1101.

Passlack et al., "GaAs Surface Passivation Using in-Situ Oxide Deposition," Applied Surface Science, 1996, pp. 441-447.

Passlack et al., "Infrared Microscopy Studies on High-Power InGaAs—GaAs—InGaP Lasers with Ga2O3 Facet Coatings," IEEE Journal of Selected Topics in Quantum Electronics, vol. 1, No. 2, Jun. 1995, pp. 110-115.

Passlack et al., "Capacitance—Voltage and Current—Voltage Characterization of AlxGa1As—GaAs Structures," J. Appl. Phys., vol. 78, No. 12, Dec. 15, 1995, pp. 7091-7098.

Hong et al., "Novel Ga2O3(Gd2O3) Passivation Techniques to Produce Low Dit Oxide—GaAs Interfaces," Journal of Crystal Growth, 1997, pp. 422-427.

Hong et al., "Low Interface State Density Oxide-GaAs Structures Fabricated by in Situ Molecular Beam Epitaxy," J. Vac. Sci. Technol. B., vol. 14, No. 3, May/Jun. 1996, pp. 2297-2300.

Passlack et al., "Low Dit, Thermodynamically Stable Ga2O3—GaAs Interfaces: Fabrication, Characterization, and Modeling," IEEE Transactions on Electron Devices, vol. 44, No. 2, Feb. 1, 1997, pp. 214-225.

Dec. 21, 2004, European Patent Office Supplemenary European Search Report for application No. EP01956104.

Oct. 26, 2005, International Search Report for PCT/US04/38582.

Oct. 29, 2001, International Search Report for PCT/US01/24263.

Apr. 4, 2002, International Search Report for PCT/US01/25150.

Dec. 20, 2001, International Search Report for PCT/US01/25259.

Jan. 16, 2002, International Search Report for PCT/US01/25161.

Mar. 3, 2004, Takebe et al., GaAs-MISFETs With Insulating Gate Films Formed by Direct Oxidation and by Oxinitridation fo Recessed GaAs Surfaces.

Becke et al., "Gallium Arsenide MOS Transistors," Solid-State Electronics, Pergamon Press 1965, vol. 8, pp. 813-823.

Passlack et al., C—V and G—V Characterization of In-Situ Fabricated Ga2O3—GaAs Interfaces for Inversion/Accumulation Device and Surface Passivation Applications, Solid-State Electronics, vol. 39, No. 8, pp. 1133-1136, 1996.

Passlack et al., "GaAs Surface Passivation Using in-Situ Oxide Deposition," Applied Surface Science 105/195 (1996) 441-447.

Passlack et al., "Infrared Microscopy Studies on High-Power InGaAs—GaAs—InGaP Lasers with Ga2O3 Facet Coatings," IEEEJournal of Selected Topics in Quantum Electronics, vol. 1, No. 2, Jun. 1995, pp. 110-116.

Passlack et al., "Capacitance-Voltage and Current-Voltage Characterization of AlxGa1—xAs—GaAs Structures," J. Appl. Phys. 78 (12), Dec. 15, 1995, pp. 7091-7098.

Hong et al., "Novel Ga2O3(Gd2O3) Passivation Techniques to Product Low Dit Oxide-GaAs Interfaces," Journal of Crystal Growth 175/176 (1997), pp. 422-427.

Passlack et al., "Low Dit, Thermodynamically Stable Ga2O3—GaAs Interfaces: Fabrication, Characterization, and Modeling," IEEE Transactions on Electron Devices, vol. 44, No. 2, Feb. 1997.

Dec. 21, 2004, European Patent Office Supplementary European Search Report for Application No. EPO1956104.

Jun. 15, 2005, International Search Report for PCT/US04/38235.

* cited by examiner

JUNCTION FIELD EFFECT METAL OXIDE COMPOUND SEMICONDUCTOR INTEGRATED TRANSISTOR DEVICES

STATEMENTS REGARDING FEDERALLY SPONSORED RESEARCH OR DEVELOPMENT

This invention was made with the support by the United States Government under US Army Aviation and Missile Command contract number DAAH01-02-C-R028. The United States may have certain rights to the invention.

FIELD OF THE INVENTION

The present invention generally relates to low power and high speed integrated circuits in the compound semiconductor field utilizing field effect transistors and more specifically to enhancement mode self-aligned metal-oxide-compound semiconductor transistors, depletion mode self-aligned metal-oxide-compound semiconductor transistors, methods of materials growth and fabrication of these transistors, and the ultra large scale integration of said transistors forming integrated circuits.

BACKGROUND OF THE INVENTION

The main barrier to the realization of a desirable Complementary Metal Oxide Semiconductor (CMOS) technology in compound semiconductors is the absence of a proper gate insulator structure and gate passivation layer that passivates the surface of a compound semiconductor structure reducing the interface state trap density and simultaneously provides for sufficient insulating properties that are necessary for low gate leakage currents in the picoamp to nanoamp range required by very large scale (VLSI) and ultra large scale (ULSI) integrated circuit technology. Field effect transistor (FETs) widely used in the III-V semiconductor industry typically employ metal gates placed directly on the compound semiconductor structure forming Schottky gate contacts that are have quiescent-state leakage currents exceeding many microamps. The use of non-insulated metal gates placed directly onto compound semiconductor technology further results in individual transistors and integrated circuits that have excessively high power dissipation, reduced transconductance, low threshold voltage, reduced logic swing and the inability to operate on a single power supply, and generally limited performance characteristics. The high magnitude of the quiescent leakage current limits the maximum integration of GaAs, InP, and GaN based devices to circuits of several hundred thousand transistors.

In contrast, conventional silicon technology has a very mature and useful complementary metal oxide semiconductor (CMOS) technology., In silicon CMOS technology an insulating layer may be formed at the silicon structure surface without the introduction or formation of an undue density of electronic traps in the combined silicon/$SiO_2$ semiconductor structure. Typically the trap density in the silicon/$SiO_2$ materials system observed before hydrogen passivation of any traps or defects is in the $10^{10}$–$10^{11}$ $cm^{-2}/eV$ at the center of the band gap. Thus, the insulating layer formed at the silicon wafer surface may act as a passivating layer that occupies dangling bonds at the silicon surface, reduces the interface state trap density in the energy gap and protects the semiconductor surface from environmental contamination, non-planar oxidation or reaction of impurities and the associated formation of electronic traps. It is well know by those skilled in the art that the electronic traps that are observed midway between the conduction band and valence band are caused by the disruption of the crystal symmetry at a semiconductor surface. Thus, excessive intermixing or disruption of the semiconductor surface at the interface between the semiconductor structure and any upper layer or layers will introduce increased electronics traps into the semiconductor structure.

The simultaneous integration of many millions of transistors is possible at high integration densities using silicon CMOS technology. These ultra high integration densities and levels cannot be obtained using metal, Schottky-style gates that are not insulated from the compound semiconductor structure in compound semiconductor FETs. Thus Si CMOS technology offers significant advantages in terms of the low gate leakage of individual transistors, and circuit integration level and manufacturing cost.

However when compared to silicon technology, compound semiconductors such as GaAs, InP, and GaN exhibit faster and more optimized speed/power performance and efficiency. The market acceptance of these GaAs, InP, and GaN integrated circuit technologies remains low because of high gate leakage in compound semiconductor MESFETS and MOSFETs, the lack of ability to demonstrate high integration densities with low amounts of operating power, and higher manufacturing cost. Thus, silicon CMOS dominates the field of low power high performance analog and digital integrated circuitry, and circuits based upon GaAs, InP, GaN technologies cannot successfully penetrate this market.

What is needed is a compound semiconductor-passivation layer-insulator structure with an improved sharpness and abruptness at the semiconductor-passivation layer interface. What is needed are new and improved compound semiconductor field effect transistors (FET). What is needed is a compound semiconductor passivation layer that is conducting in a manner that allows the formation of a JFET-type junction adjacent to the channel. What is needed are p-type and n-type conducting passivation layers useful in JFET structure formation. What is needed are JFETs with a reduced gate leakage. What is also needed are new and improved compound semiconductor FETs using metal-oxide-semiconductor junctions (MOSFET). What is also needed are new and improved compound semiconductor MOSFETs using a self-aligned gate structure. What is also needed are new and improved self-aligned compound semiconductor MOSFETs using enhancement mode and depletion mode operation. What is also needed are new and improved self-aligned compound semiconductor MOSFETs with stable and reliable device operation. What is also needed are new and improved self-aligned compound semiconductor MOSFETs which enable optimum compound semiconductor device performance. What is also needed are new and improved self-aligned compound semiconductor MOSFETs with optimum efficiency and output power for RF and microwave applications. What is also needed are new and improved self-aligned compound semiconductor MOSFETs for use in complementary circuits and architectures. What is also needed are new and improved self-aligned compound semiconductor MOSFETs for low power/high performance complementary circuits and architectures. What is also needed are new and improved self-aligned compound semiconductor MOSFETs which offer the design flexibility of complementary architectures. What is also needed are new and improved self-aligned compound semiconductor MOSFETs which keep interconnection delays in ultra large scale integration under control. What is needed are new and useful complementary integrated circuits where each individual transistor has a leakage current approaching $10^{-12}$ amp. What is needed is a truly useful integrated circuit technology for GaAs, InP, and GaN that allows for the useful and economical operation of ULSI digital integrated circuits in compound semiconductors. What is needed are new and improved compound semiconductor MOSFET integrated circuits with very low net power dissipation. What is needed are new and improved compound semiconductor MOSFET devices with low gate leakage currents that may be integrated together to form ultra large scale integrated circuits that include millions of transistors. What is needed are new and improved complementary MOSFET devices and circuits in compound semiconductors that allow the direct use, transfer and application of silicon CMOS design that already exits in the art.

What is also needed are new and improved methods of fabrication of self-aligned compound semiconductor MOSFETs. What is also needed is new and improved methods of fabrication of self-aligned compound semiconductor MOSFETs that are compatible with established complementary GaAs heterostructure FETs technologies. What is also needed are new and improved compound semiconductor MOSFETs which are relatively easy to fabricate and use.

SUMMARY OF THE INVENTION

A first aspect of the present invention generally relates to the interface between the compound semiconductor structure and the gate insulating structure. It is well known to those skilled in the art that for best results the abruptness of the interface between the compound semiconductor structure and the conductive passivating+insulating layer adjacent to the compound semiconductor structure should be reduced to one atomic layer in order to reduce the density of electronic traps in the resulting metal oxide semiconductor transistor device. If the interface between the compound semiconductor structure and the passivating and insulating layer varies by 3 or more atomic layers the electronic traps density will rise to levels that will cause the electrical behavior of the resulting transistor structure to be irreproducible due to charging and discharging of a large number of electronic traps. If the operation of a transistor is not reproducible as a function of voltage and current, the transistor is not useful. The abruptness of the interface between the compound semiconductor structure and the gate insulating structure may be improved by epitaxially growing the compound semiconductor structure before the oxide is deposited. A compound semiconductor structure with an atomically smooth upper surface is most desirable. The smoothness of a compound semiconductor growth during epitaxial growth processes such a Molecular Beam Epitaxy, Chemical Beam Epitaxy, Metal Organic Chemical Vapor Deposition, and related techniques may be improved by reducing the overall epitaxial growth rate while maintaining the substrate temperatures. For example in molecular beam epitaxy it is most common to produce compound semiconductor epitaxial layered structures at growth rates of between 2.0–3.5 angstroms per second. The interfaces produced by compound semiconductor epitaxial wafer growths that proceed at this rate and higher rates often lead to compound semiconductor surfaces that have a roughness of more than 3 atomic layers as observed by techniques such as Reflection High Energy Electron Diffraction (RHEED), atomic force microscopy, and scanning tunneling microscopy. Increased growth surface roughness have been observed in the RHEED features when the epitaxial layer growth proceeds at rates above 2.5 angstroms per second.

By reducing the growth rate of GaAs and other compound semiconductors to below 1 angstrom per second for surface layers of compound semiconductor structures including GaAs, InP, GaN and other compound semiconductor semiconductors surface roughness may be reduced.

A second aspect of the present invention generally relates to a gate insulating structure comprised of a multi-layer stack of indium and gallium containing oxides that includes indium oxide in the first passivating layer adjacent to the compound semiconductor structure and a second, third, fourth etc.... insulating layer comprised of gallium, oxygen and at least one rare-earth element. A third aspect of the present invention generally relates to a gate insulating structure comprised of a multi-layer stack of indium and gallium containing oxides that include indium oxide in the first passivating layer adjacent to the compound semiconductor structure and second insulating layer comprised of gallium, sulphur, and at least one rare-earth element. A fourth aspect of this invention is that oxygen and sulphur may be used interchangably in the passivation and insulating layers placed upon the compound semiconductor structures where the other elements in the passivation and insulating layers layer remain fixed. A fifth aspect of the invention is to provide for a conducting passivation layer adjacent to the compound semiconductor structure that may possess either p-type of n-type conductivity allowing for the formation of a JFET structure utilizing n-type and p-type compound semiconductors respectively. The indium oxide compounds layer may further incorporate fractions of other elements that are able to allow the formation of the layers that are either p-type or n-type in conductivity. In addition the deposition conditions of the indium oxygen layers may be utilized to further establish the conductivity of the indium oxide layers as p-type and n-type. Parameters such as substrate temperature, oxygen overpressure, deposition rate, and the incorporation of other elements including tin may be adjusted to provide for different levels of p-type and n-type doping. Normally, an ultra high vacuum technique called molecular beam epitaxy or chemical beam epitaxy is used to form these gate insulating structures. During the epitaxial growth of such structures, interfacial smoothness may be monitored using an in-situ electron diffraction technique called Reflection High Energy Electron Diffraction (RHEED) to monitor the smoothness of the interface formed between the gate insulating structures and the compound semiconductor material. If the RHEED features are linearly sharp possessing a minimum of dots or discontinuous structure, those skilled in the art of RHEED would identify that the interface remains atomically smooth with a maximum abruptness during the deposition of oxide materials on the compound semiconductor structure. The RHEED features slowly disappear as the oxide deposition proceeds on the compound semiconductor structure showing that the materials pass from crystalline structure in the compound semiconductor, to oxide structure that has long range 2D order in the first 1–2 monolayers of oxide, to an amorphous-like structure as the deposition proceed for the next 25 angstroms, to an amorphous structure within 75 angstroms of total oxide structure growth. Previously, utilizing only Ga-oxides during deposition the RHEED pattern is observed to possess a discontinuous (i.e. non-streaky) pattern before its disappearance as the oxide thickness increases. During deposition of the initial indium, the same type of streaky RHEED pattern can be observed as in the case of Ga-oxide based passivation layers.

A sixth aspect of the present invention generally relates to increased surface mobility of indium oxides on the epitaxial surface as compared to that of gallium oxides. Generally, species with higher surface mobilities at any given temperature may be deposited in a monolayer-by-monolayer manner at reduced substrate temperature. Thus, the increased surface mobility observed for indium oxide allows for deposition of good electrical quality in a wider temperature window than allowed by gallium oxide containing passivation layers.

A seventh aspect of this invention generally relates to the use of indium oxide compounds for the manufacturing of a generally conductive interfaces between the top layers of the gate insulating structure and the compound semiconductor surface. The initial indium oxide passivation layer that forms the initial and lowest passivation layer of a gate insulating structure, without eliminating the nominally insulating/semiconducting properties of the gallium oxide+one rare earth layer deposited upon the initial indium oxide layer adjacent to the compound semiconductor structure surface.

A eight aspect of the present invention generally relates to a method for improving the smoothness of the surface of the compound semiconductor structure by incorporating interruptions in the epitaxial growth under ultra high vacuum conditions, and then initiate growth by alternately exposing the surface of the compound semiconductor to ½ monolayers of a group III element (i.e. Ga, In, Al, Tl) followed by the exposure of ½ a monolayer of a group V element (i.e. As, P, Sb, N) for the case of III-V compound semiconductor structures. This aspect of compound semiconductor growth is referred to as migration enhanced epitaxy and is used by those skilled in compound semiconductor growth techniques of Molecular Beam Epitaxy, Chemical Beam Epitaxy, Metal Organic Chemical Vapor Deposition and the related epitaxial growth techniques.

A ninth aspect of the invention is that a p-n junction may be formed between the top layer of the compound semiconductor structure and the first layer of the gate insulator structure. An example of this embodiment would be the use of an InGaAs channel in the compound semiconductor structure that transports current using electrons, while depositing a p-type indium oxide layer on top of the compound semiconductor layer. Similarly, a p-channel compound semiconductor channel and an n-type passivating+insulating structure would form a junction field effect transistor structure as well.

There has thus been outlined features of the invention in order that the detailed description thereof that follows may be better understood, and in order that the present contribution to the art may be better appreciated. There are, of course, additional features of the invention that will form the subject matter of the claims appended hereto. In this respect, before explaining at least one embodiment of the invention in detail, it is to be understood that the invention is not limited in its application to the details of construction and to the arrangements of the components set forth above or in the following description or illustrated in the drawings. The invention is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE DRAWINGS

Figure 1:
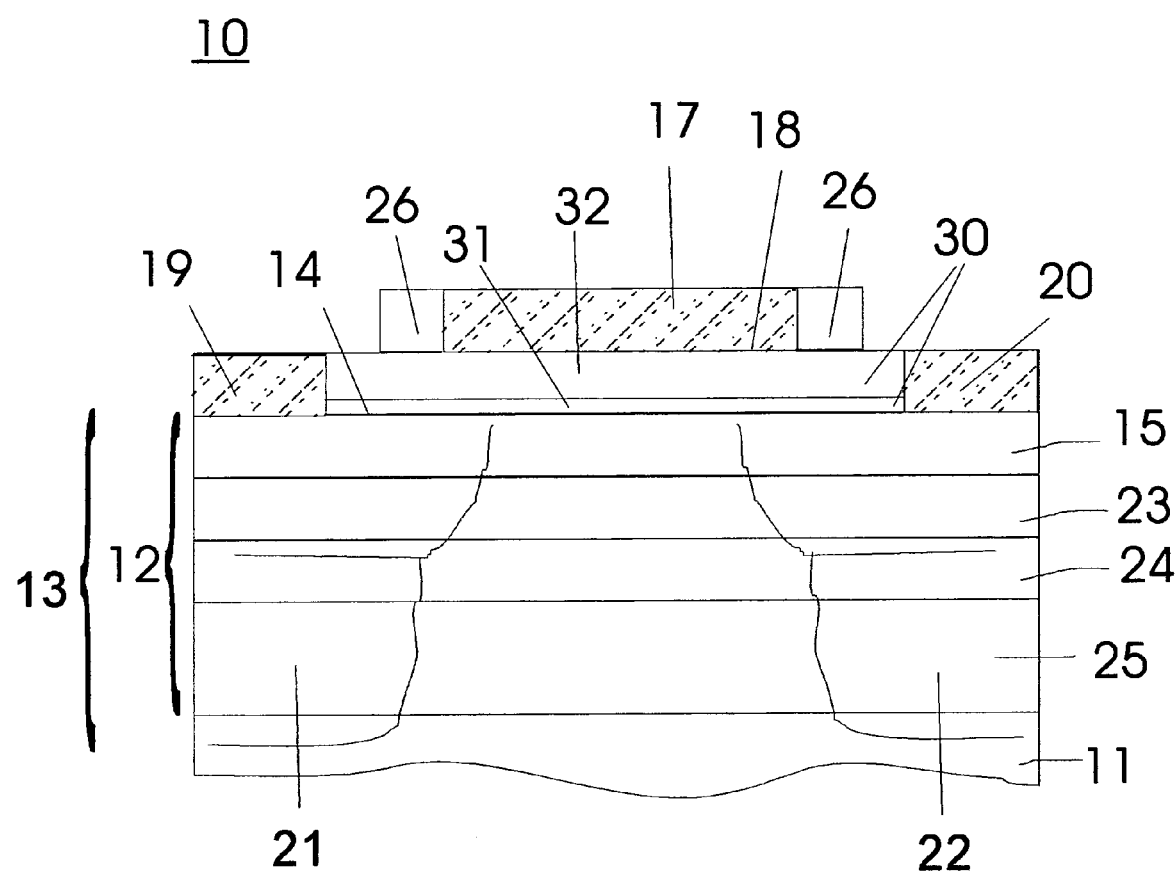
FIG. 1 is a simplified cross sectional view of a self-aligned enhancement mode compound semiconductor MOSFET in accordance with a preferred embodiment of the present invention.

The present invention provides, among other things, a self-aligned enhancement mode metal-oxide-compound semiconductor FET and integrated circuit utilizing these FETs. The FET includes an indium oxygen passivating+insulating structure that is comprised of at least two layers. The first layer is most preferably one monolayer in thickness or approximately 3 angstroms thick but preferably less that 25 angstroms in thickness and composed substantially of indium oxygen compounds including but not limited to stoichiometric $In_2O_3$, $In_2O$, and possibly a lesser fraction of other indium oxygen compounds. The upper insulating layer in the gate insulating structure is composed of an insulator that does not intermix with the underlying indium gallium oxygen passivating structure. This upper layer must possess excellent insulating qualities, and is most typically composed of gallium oxygen and a third rare earth element Alternatively, the upper insulating layer may be comprised of gallium sulfur and a third rare earth element and that together form a ternary insulating material. In another embodiment the upper insulating layer may also be composed of gallium oxygen sulfur compounds with the addition of at least one rare earth element. Therefore the entire gate insulating structure is comprised of at least two layers where the lower layer directly adjacent to the compound semiconductor structure is comprised of indium gallium and oxygen and an upper layer comprised of at least two of the elements of indium, gallium, oxygen, sulfur, with the addition of at least one rare earth element. In addition an intermediate graded layer that is comprised of a fractional mixture of the lower and upper materials may also exist in the passivating and insulating structure for compound semiconductor structures. Together the initial indium oxygen layer, any intermediate graded layer and the top insulating region form both a indium gallium oxide insulating structure and the gate insulator region of a metal-oxide-compound semiconductor field effect transistor. The initial indium oxygen layer forms an atomically abrupt interface with the top layer of the compound semiconductor wafer structure, and does not introduce midgap surface states into the compound semiconductor material. A refractory metal gate electrode is preferably positioned on the upper surface of the gate insulator structure layer. The refractory metal is stable on the gate insulator structure layer at elevated temperature. Refractory metals with lower work functions such as iridium and platinum are most suitable for the formation of enhancement mode transistor devices in this metal oxide semiconductor transistor technology. Self-aligned source and drain areas, and source and drain contacts are positioned on the source and drain areas. In all embodiments preferred and otherwise, the metal-oxide-sulfide-compound semiconductor transistor includes multi-layer gate insulator structure including an initial indium, gallium oxygen layer, intermediate transition layer, and upper insulating layer of 30–250 angstroms in thickness positioned on upper surface of a compound semiconductor heterostructure that form the gate insulator structure. The preferred embodiment also comprises a compound semiconductor heterostructure including a GaAs, $Al_xGa_{1-x}As$ and $In_yGa_{1-y}As$ layers with or without n-type and/or p-type charge supplying layers which are grown on a compound semiconductor substrate, a refractory metal gate of Pt, Ir, W, WN, or WSi, with or without self aligned donor (n-channel FET) or acceptor (p-channel FET) implants, and source and drain ohmic contacts. In another preferred embodiment, the compound semiconductor heterostructure comprises an $In_yGa_{1-y}As$, $Al_xIn_{1-x}As$, and InP compound semiconductor heterostructure and n-type and/or p-type charge supplying layers which are grown on an InP substrate, and a refractory metal gate of Pt, Ir, W, WN, or WSi, self aligned donor (n-channel FET) or acceptor (p-channel FET) implants, and source and drain ohmic contacts. In another preferred embodiment the compound semiconductor heterostructure comprises an GaN, $Al_yGa_{1-y}N$, or $In_{1-x}Ga_xN$, $Al_yGa_{1-y}N$ compound semiconductor heterostructure and n-type and/or p-type charge supplying layers which are grown on an InP substrate, and a refractory metal gate of Pt, Ir, W, WN, or WSi, self aligned donor (n-channel FET) or acceptor (p-channel FET) implants, and source and drain ohmic contacts. In another preferred embodiment the $GaN/Al_yGa_{1-y}N$ compound semiconductor structure possess n-type charge in the channel of the structure that results from the piezoelectric strain in the compound semiconductor structure.

FIG. 1 is simplified cross sectional view of a self-aligned enhancement mode compound semiconductor MOSFET in accordance with a preferred embodiment of the present invention. Device 10 includes a compound semiconductor material, such as any III-V material employed in any semiconductor device, represented herein by a III-V semiconductor or insulating substrate 11 and a compound semiconductor epitaxial layer structure 12. For the purpose of this disclosure, the substrate 11 and any epitaxial layer structure 12 formed thereon will be referred to simply as a compound semiconductor wafer structure which in FIG. 1 is designated 13. Methods of fabricating semiconductor wafer structure 13 include, but are not limited to, molecular beam epitaxy (MBE) and metal organic chemical vapor deposition (MOCVD), Chemical Beam Epitaxy (CBE) and the associated deposition techniques. It will of course be understood that in some specific applications, there may be no epitaxial layers present and upper surface of top layer 15 may simply be the upper surface of substrate 11.

Device 10 further comprises a gate insulator structures (30) that includes at least two or more layers. The first layer of the gate insulator structure (31) is composed entirely of indium oxide compounds and is directly adjacent to and deposited upon the compound semiconductor structure. The second layer of the gate insulator structure (32) is composed of a compound of gallium, oxygen, and one or more rare earth elements, or gallium sulphur, and one or more rare earth elements from the periodic table. The initial indium oxygen layer (31) forms an atomically abrupt interface 14 with the upper surface of top layer 15, the top layer of the compound semiconductor structure. A refractory metal gate electrode 17 which is stable in the presence of top insulating material at elevated temperature is positioned on upper surface 18 of the gate insulator structure. Dielectric spacers 26 are positioned to cover the sidewalls of metal gate electrode 17. Source and drain contacts 19 and 20 are deposited on self-aligned source and drain areas 21 and 22, respectively.

In a specific embodiment, the compound semiconductor epitaxial layer structure consists of a <11 angstrom GaAs top layer (15), a <101 angstrom $Al_xGa_{1-x}As$ spacer layer (23), a <251 angstrom $In_yGa_{1-y}As$ channel layer (24), and an $Al_xGa_{1-x}As$ buffer layer (25) grown on a GaAs substrate (11). Top GaAs layer (15) is used to form an atomically abrupt layer with the gate insulator structure with an abrupt interface with low defect density.

As a simplified example of fabricating a self-aligned enhancement mode compound semiconductor MOSFET in accordance with a preferred embodiment of the present invention, a III-V compound semiconductor wafer structure 13 with an atomically ordered pure and chemically clean upper surface of top layer 15 is prepared in an ultra-high vacuum semiconductor growth chamber and transferred via a ultra high vacuum transfer chamber to a second ultra high vacuum oxide and insulator deposition chamber. The initial indium oxygen layer (31) is deposited on upper compound semiconductor surface layer 15 using thermal evaporation from a high purity or vacuum deposition grade $In_2O_3$ sources or indium gadolinium garnet, $In_3Gd_5O_{12}$. This initial indium oxygen layer is deposited while holding the substrate temperature of the compound semiconductor structure at <450° C., and more preferably at a substrate temperature <405° C., and most preferably at a substrate temperature between 250° C. and 400° C. After the deposition of approximately 3 angstroms of indium oxygen compounds in the insulator deposition chamber over a 2 to 5 minute period of time, deposition of the second insulator layer is initiated. The deposition of the second insulator layer starts by directing the flux from a low power oxygen plasma source into the ultra high vacuum system such that the molecular oxygen or oxygen plasma effluent and species are largely directed toward and impinging upon said compound semiconductor structure with initial gallium oxygen layer. The flux from the oxygen source that may include molecular oxygen, atomic oxygen most typically produced with or without plasma, or some combination of molecular and atomic oxygen, should be directed at the surface for between 2–5 seconds, subsequently followed by the co-evaporation of gallium oxygen compounds from $Ga_2O_3$, indium oxygen compounds from $In_2O_3$, and a third thermal evaporation or e-beam source that contains a rare-earth element (e.g. Gd) or rare earth oxide compound ($Gd_2O_3$). The flux beams from the oxygen source, $In_2O_3$, $Ga_2O_3$ and rare-earth evaporation source thermal evaporation sources are carefully balanced to provide a ternary insulator layer on top of the initial indium oxygen layer on said compound semiconductor structure. As the deposition of the second insulator layer is initiated, the substrate temperature is simultaneously adjusted to provide an optimized substrate temperature for the deposition of this layer. In this example the substrate temperature required to deposit the gallium+oxygen+rare earth layer is <510° C. In another preferred embodiment this second insulating layer is comprised of gallium sulphur and at least and at least one rare earth element. In yet another preferred embodiment, this second insulating layer is comprised of gallium, oxygen, at least one rare earth element, and a fraction of indium adjusted to allow the layer to possess sufficient insulating properties. In yet another preferred embodiment, this second insulating layer is comprised of gallium, sulphur, at least one rare earth element, and an indium fraction adjusted to allow the layer to possess sufficient insulating properties. The deposition of this second insulator layer proceeds until the total insulator thickness of 50–250 angstroms is achieved. Shutters and valves are utilized to stop the deposition of the second insulting layer upon the deposition of the required thickness of the insulator layer. The substrate temperature is cooled in-vacuum to approximately 200° C., and the deposition of a refractory metal which is stable and does not interdiffuse with on the top layer of the gate insulator structure at elevated temperature such as Ir, Pt, WSi or WN is deposited on upper surface 18 of oxide layer 32 and subsequently patterned using standard lithography. The refractory metal layer is etched until oxide layer 31 is exposed using a refractory metal etching technique such as a fluorine based dry etching process. The refractory metal etching procedure does not etch the oxide layer 31, thus, oxide layer 31 functions as an etch stop layer such that upper surface of top layer 15 remains protected by oxide layer 31. All processing steps are performed using low damage plasma processing. Self-aligned source and drain areas 21 and 22, respectively are realized by lithography and possibly with or without ion implantation of Si (n-channel device) and Be/F or C/F (p-channel device) using the refractory metal gate electrode 17 and the dielectric spacers 26 as implantation masks. Such ion implantation schemes are compatible with standard processing of complementary compound semiconductor heterostructure FET technologies and are well known to those skilled in the art. In addition, ion implantation layers are not necessary for the formation of compound semiconductor MOSFETs if modulation doping or other doped layers are provided during the epitaxial growth of the compound semiconductor structure. The implants, if present in the device or circuit, are activated at 700–950° C. using rapid thermal annealing in an ultra high vacuum environment such that degradation of the interface 16 established between top layer 15 and oxide layer 31 is completely excluded. Finally, ohmic source and drain contacts 19 and 20 are deposited on the self-aligned source and drain areas 21 and 22, respectively. The devices may then be interconnected using the standard methods to those skilled in the art of integrated microelectronics and integrated circuit manufacture.

Figure 2:
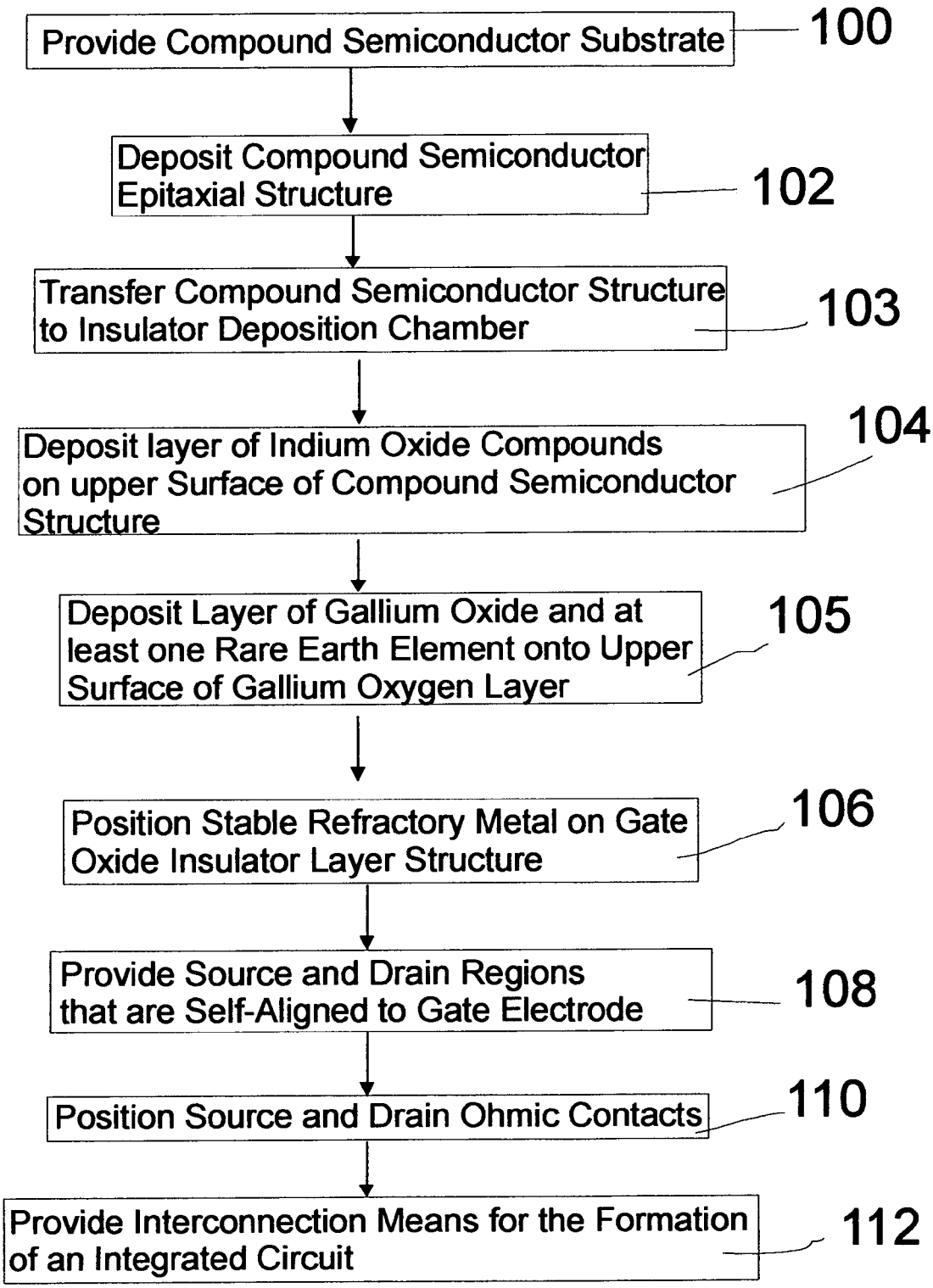
FIG. 2 is a simplified flow chart illustrating a method of manufacturing a self-aligned enhancement mode compound semiconductor MOSFET in accordance with a preferred embodiment of the present invention. The exemplification set out herein illustrates a preferred embodiment of the invention in one form thereof, and such exemplification is not intended to be construed as limiting in any manner.

FIG. 2 is a simplified flow chart illustrating a method of manufacturing a self-aligned enhancement mode compound semiconductor MOSFET in accordance with a preferred embodiment of the present invention. In step 102, a compound semiconductor wafer structure is produced using standard epitaxial growth methods in the art. In step 103, a layer consisting of indium oxygen compounds including but not limited to $In_2O_3$ and $In_2O$, is deposited on upper surface of said compound semiconductor wafer structure. In step 104, an insulating layer of gallium oxygen and one or more rare earth elements is deposited on the upper surface of the initial gallium oxygen compound layer. The gallium oxide gate insulator structure is formed in steps 104 and 105. In step 106, a stable refractory gate metal is positioned on upper surface of said gate insulator structure. In step 108, source and drain ion implants are provided self-aligned to the gate electrode. In step 110, source and drain ohmic contacts are positioned on ion implanted source and drain areas.

In a preferred embodiment, step 100 provides a compound semiconductor substrate such as GaAs, InP, or various GaN substrates including: GaN-on-Sapphire, GaN—AlN-on-Sapphire, GaN—AlN-on-SiC, GaN—AlN—C-Silicon, and GaN-on-GaN. Step 102 includes the preparation and epitaxial growth of an atomically ordered and chemically clean upper surface of the compound semiconductor wafer structure. Step 103 preferably comprises thermal evaporation from a purified and crystalline gadolinium gallium garnet or $Ga_2O_3$ source on an atomically ordered and chemically clean upper surface of the compound semiconductor wafer structure. Step 104 comprises the formation of a indium+gallium+oxygen+rare earth elemental insulating layer or a gallium+oxygen+rare earth insulating layer formed through the simultaneous vacuum evaporation of gallium oxygen species, indium oxygen species and at least one rare earth element such as gadolinium with the simultaneous oxidation using the effluent of an oxygen molecular oxygen or gas plasma source directed in simultaneous combination with other thermal evaporation sources toward substrate 100. The initial indium gallium oxygen compound layer of the gate insulator structure preferably functions as an etch stop layer such that the upper surface of the compound semiconductor wafer structure remains protected by the gate oxide during and after gate metal etching. The refractory gate metal desirably does not react with or diffuse into the gate oxide layer during high temperature annealing of the self-aligned source and drain ion implants. The quality of the interface formed by the gate oxide layer and the upper surface of the compound semiconductor structure is desirably preserved during high temperature annealing of the self-aligned source and drain ion implants. The self-aligned source and drain implants are desirably annealed at approximately 700–950° C. in an ultra high vacuum environment. The self-aligned source and drain implants are desirably realized by positioning dielectric spacers on the sidewalls of the refractory gate metal.

Figure 3:
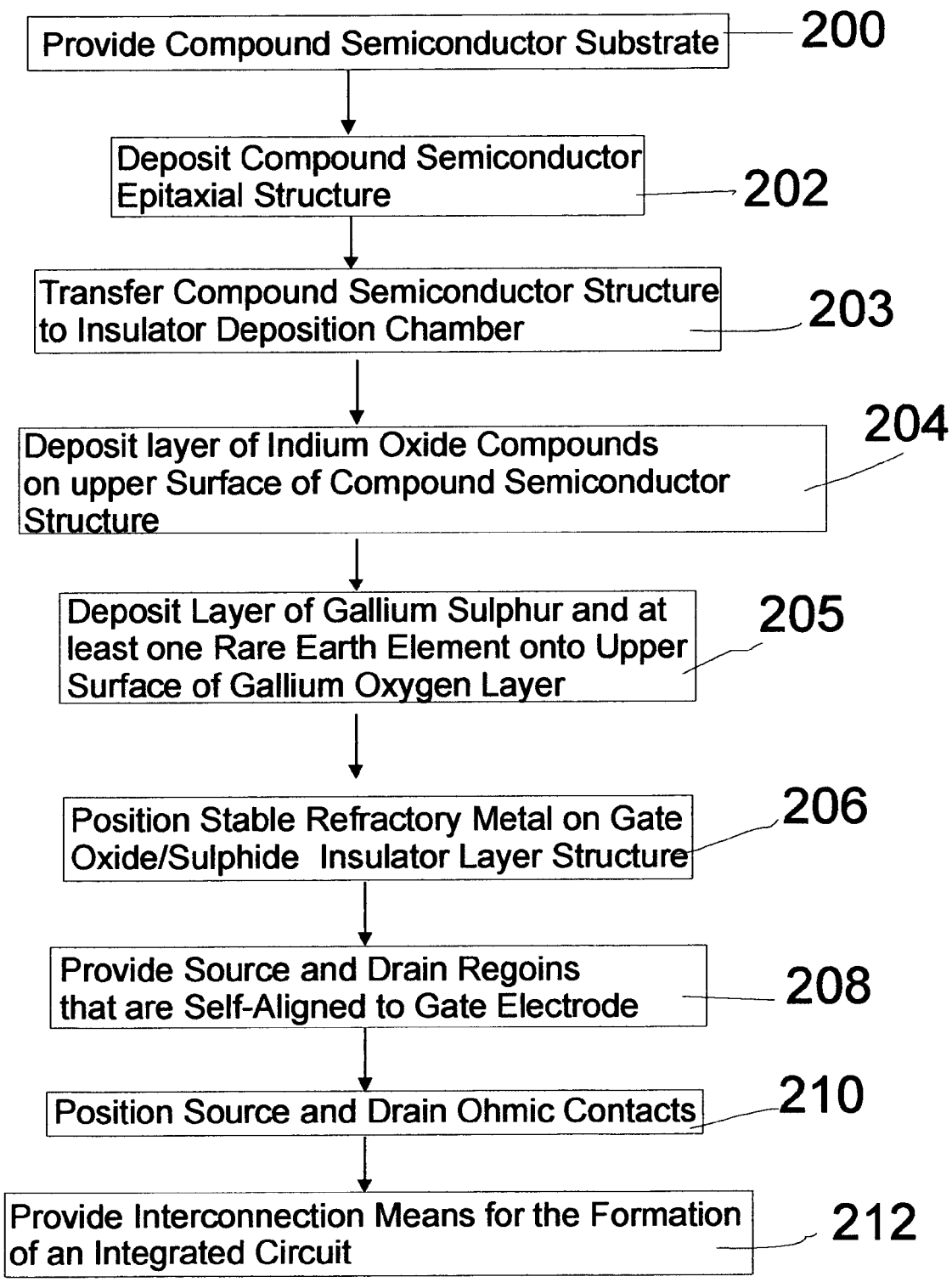
FIG. 3 is a simplified flow chart illustrating a method of manufacturing a self-aligned enhancement mode compound semiconductor MISFET in accordance with another preferred embodiment of the present invention. The exemplification set out herein illustrates a preferred embodiment of the invention in one form thereof, and such exemplification is not intended to be construed as limiting in any manner.

FIG. 3 is a simplified flow chart illustrating a method of manufacturing a self-aligned enhancement mode compound semiconductor MISFET in accordance with another preferred embodiment of the present invention. In step 202, a compound semiconductor wafer structure is produced using standard epitaxial growth methods in the art. In step 203, a layer consisting of indium oxygen compounds including but not limited to $In_2O_3$ and $In_2O$ are deposited on upper surface of said compound semiconductor wafer structure. In step 204, an insulating layer of gallium sulphur and one or more rare earth elements is deposited on the upper surface of the initial gallium oxygen compound layer. The gallium oxide-sulphide gate insulator structure is formed in steps 204 and 205. In step 206, a stable refractory gate metal is positioned on upper surface of said gate insulator structure. In step 208, source and drain regions are self-aligned to the gate electrode. In step 210, source and drain ohmic contacts are positioned source and drain areas that may or may not be formed using ion implantation.

In a preferred embodiment, step 200 provides a compound semiconductor substrate such as GaAs, InP, or various GaN substrates including: GaN-on-Sapphire, GaN—AlN-on-Sapphire, GaN—AlN-on-SiC, GaN—AlN—C-Silicon, and GaN-on-GaN. Step 202 includes the preparation and epitaxial growth of an atomically ordered and chemically clean upper surface of the compound semiconductor wafer structure. Step 203 preferably comprises thermal evaporation from a purified and crystalline gadolinium gallium garnet or $Ga_2O_3$ source on an atomically ordered and chemically clean upper surface of the compound semiconductor wafer structure. Step 204 comprises the formation of a indium+gallium+oxygen+rare earth elemental insulating layer or a gallium+oxygen+rare earth insulating layer formed through the simultaneous vacuum evaporation of gallium oxygen species, indium oxygen species and at least one rare earth element such as Gadolinium with the simultaneous oxidation using the effluent of an oxygen gas plasma source directed in simultaneous combination with other thermal evaporation sources toward substrate 200. The initial indium gallium oxygen compound layer of the gate insulator structure preferably functions as an etch stop layer such that the upper surface of the compound semiconductor wafer structure remains protected by the gate oxide during and after gate metal etching. The refractory gate metal desirably does not react with or diffuse into the gate oxide layer during high temperature annealing of the self-aligned source and drain ion implants. The quality of the interface formed by the gate oxide layer and the upper surface of the compound semiconductor structure is desirably preserved during high temperature annealing of the self-aligned source and drain ion implants. The self-aligned source and drain implants are desirably annealed at approximately 700–950° C. in an ultra high vacuum environment. The self-aligned source and drain implants are desirably realized by positioning dielectric spacers on the sidewalls of the refractory gate metal.

It will now be understood that what has been disclosed herein includes new compound semiconductor devices and methods of fabrication. Those having skill in the art to which the present invention relates will now as a result of the teaching herein perceive various modifications. Accordingly, all such modifications are deemed to be within the scope of the invention that is to be limited only by the claims.

Thus, new and improved compound semiconductor devices and methods of fabrication are disclosed. The new and improved self-aligned enhancement mode metal-oxide-compound semiconductor heterostructure field effect transistors enable stable and reliable device operation, provide optimum compound semiconductor device performance for low power/high performance complementary circuits and architectures, keep interconnection delay in VLSI and ULSI under control, and provide optimum efficiency and output power for RF and microwave applications as well as for digital integrated circuits that require very high integration densities.

These improvements essentially solve or overcome the problems of the prior art, such as high gate leakage in compound semiconductor FET devices, low integration densities, dc electrical instability, and electrical hysteresis, and therefore provide a highly useful invention. While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed:

1. A metal-oxide-compound semiconductor field effect transistor comprising:
    a compound semiconductor wafer structure having an upper surface;
    a gate insulator structure comprising a first layer and a second layer;
    said first layer substantially comprising compounds of indium and oxygen;
    said second layer comprising compounds of gallium and oxygen and at least one rare earth element;
    a gate electrode positioned on said gate insulator structure;
    source. and drain regions self-aligned to said gate electrode; and
    source and drain ohmic contacts positioned on said source and drain regions.

2. The transistor of claim 1 wherein said first layer forms an atomically abrupt interface with said upper surface.

3. The transistor of claim 1 wherein said gate insulator structure comprises at least three layers, said at least three layers including a graded layer that contains varying compositions of indium, gallium, oxygen, and at least one rare-earth element.

4. The transistor of claim 3 wherein said gate insulator structure further comprises a third layer comprising indium, gallium, and oxygen.

5. The transistor of claim 1 wherein said field effect transistor is an enhancement mode transistor.

6. The transistor of claim 1 wherein said field effect transistor is a depletion mode transistor.

7. The transistor of claim 1 wherein said first layer has a thickness of more than 3 angstroms and less than 25 angstroms.

8. The transistor of claim 1 wherein said gate insulator structure has a thickness of 20–300 angstroms.

9. The transistor of claim 1 wherein said first layer forms an interface with said upper surface that extends less than four atomic layers.

10. The transistor of claim 1 wherein said first layer protects said upper surface.

11. The transistor of claim 1 wherein said gate electrode comprises a refractory metal which is stable in the presence of said gate insulator structure at 700 Centigrade.

12. The transistor of claim 1 wherein said source and drain regions are ion implanted to provide for one at least one of an n-type and a p-type region.

13. The transistor of claim 1 wherein said source and drain regions provide at least one of an n-channel and a p-channel.

14. The transistor of claim 1 wherein implants in said source and drain regions comprise at least one of Be, Si, Te, Sn, C, and Mg.

15. The transistor of claim 1 wherein said upper surface comprises GaAs.

16. The transistor of claim 1 wherein said upper surface comprises $In_xGa_{1-x}As$.

17. The transistor of claim 1 wherein said upper surface comprises $Al_xGa_{1-x}As$.

18. The transistor of claim 1 wherein said upper surface comprises GaN.

19. The transistor of claim 1 wherein said upper surface comprises $In_xGa_{1-x}N$.

20. The transistor of claim 1 wherein said upper surface comprises $Al_xGa_{1-x}N$.

21. The transistor of claim 1 wherein said upper surface comprises $In_zGa_{1-z}Sb$.

22. The transistor of claim 1 wherein said upper surface comprises InP.

23. The transistor of claim 1 wherein said gate electrode comprises a metal selected from the group consisting of Pt, Ir, W, WN, TiWN, WSi and combinations thereof.

24. A metal-oxide-compound semiconductor field effect transistor comprising:
- a compound semiconductor wafer structure having an upper surface;
- a gate insulator structure on said upper surface, said gate insulator structure comprising a first layer, a second layer, and a third layer;
- said first layer substantially comprising compounds of indium and oxygen;
- said second layer comprising compounds of indium, gallium, and oxygen, and at least one rare earth element;
- said third layer above said second layer, said third layer substantially comprising gallium, oxygen, and at least one rare earth element, said third layer being insulating;
- a gate electrode positioned on said gate insulator structure;
- source and drain regions self-aligned to said gate electrode; and
- source and drain ohmic contacts positioned on ion implanted source and drain areas of said source and drain regions.

25. The transistor of claim 24 wherein said first layer forms an atomically abrupt interface with said upper surface.

26. The transistor of claim 24 wherein said third layer further comprises indium.

27. The transistor of claim 24 wherein said field effect transistor is an enhancement mode transistor.

28. The transistor of claim 24 wherein said field effect transistor is a depletion mode transistor.

29. The transistor of claim 24 wherein said first layer has a thickness of more than 3 angstroms and less than 25 angstroms.

30. The transistor of claim 24 wherein said gate insulator structure has a thickness of 20–300 angstroms.

31. The transistor of claim 24 wherein said first layer forms an interface with said upper surface that extends less than four atomic layers.

32. The transistor of claim 24 wherein said first layer protects said upper surface.

33. The transistor of claim 24 wherein said gate electrode comprises a refractory metal which is stable in the presence of said gate insulator structure at 700° C.

34. The transistor of claim 24 wherein said source and drain regions are ion implanted to provide for at least one of an n-type and a p-type region.

35. The transistor of claim 24 wherein said source and drain regions provide at least one of an n-channel and a p-channel.

36. The transistor of claim 24 wherein implants in said source and drain regions comprise at least one of Be, Si, Te, Sn, C, and Mg.

37. The transistor of claim 24 wherein said upper surface comprises GaAs.

38. The transistor of claim 24 wherein said upper surface comprises $In_xGa_{1-x}As$.

39. The transistor of claim 24 wherein said upper surface comprises AlxGa1–xAs $Al_xGa_{1-x}As$.

40. The transistor of claim 24 wherein said upper surface comprises GaN.

41. The transistor of claim 24 wherein said upper surface comprises $In_xGa_{1-x}N$.

42. The transistor of claim 24 wherein said upper surface comprises $Al_xGa_{1-x}N$.

43. The transistor of claim 24 wherein said upper surface comprises $In_zGa_{1-z}Sb$.

44. The transistor of claim 24 wherein said upper surface comprises InP.

45. The transistor of claim 24 wherein said gate electrode comprises a metal selected from the group consisting of Pt,Ir,W,WN,TiWN,WSi,and combinations thereof.

46. A metal-oxide-compound semiconductor field effect transistor comprising:
- a compound semiconductor wafer structure having an upper surface;
- a multilayer gate insulator structure on said upper surface, said multilayer gate insulator structure comprising a sequence of layers of compositions alternating between a first composition comprising indium, gallium, at least one of oxygen and sulphur, and at least one rare earth element and a second composition comprising indium, gallium, at least one of oxygen and sulphur, and at least one rare earth element;
- a gate electrode positioned on said gate insulator structure;
- source and drain regions self-aligned to said gate electrode; and
- source and drain ohmic contacts positioned on ion implanted source and drain areas of said source and drain regions.

47. The transistor of claim 46 wherein said gate electrode comprises a metal selected from the group consisting of Pt, Ti, W, WN, TiWN, WSi and combinations thereof.

48. A metal-oxide-compound semiconductor field effect transistor comprising:
- a compound semiconductor wafer structure having an upper surface;
- a gate insulator structure positioned on said upper surface of said compound semiconductor wafer structure;
- a gate electrode positioned on said gate insulator structure;
- source and drain regions self-aligned to said gate electrode; and
- source and drain ohmic contacts positioned on ion implanted source and drain areas of said source and drain regions;
- wherein said compound semiconductor structure comprises a layer formed from $Al_xGa_{1-x}As$, $In_yGa_{1-y}As$, $Al_vIn_{1-v}As$, $In_zGa_{1-z}P$, $Al_xGa_{1-x}N$, $In_yGa_{1-y}N$, GaN, said layer on said upper surface;
- a substrate on which resides said compound semiconductor wafer structure; and
- wherein said substrate includes an InP or GaN based semiconductor wafer.

49. A metal-oxide-compound semiconductor field effect transistor comprising:
- a compound semiconductor wafer structure having an upper surface;
- a gate insulator structure comprising a first layer and a second layer;
- said gate insulator structure on said upper surface;
- said first layer substantially comprising compounds of indium and oxygen;
- said second layer comprising compounds of gallium, oxygen, and at least one rare earth element; and
- a gate electrode positioned on said gate insulator structure.

50. The transistor of claim 49 wherein said gate electrode comprises a refractory metal.

51. The transistor of claim 50 wherein said refractory metal comprises a member of the group Pt, fr, W, WN, TiWN, WSi, and combinations thereof.

52. The transistor of claim 49 wherein said gate insulator structure further comprises a third layer.

53. The transistor of claim 52 wherein compounds of said third layer comprise gallium, oxygen, and a rare earth element.

54. The transistor of claim 53 wherein a composition of said third layer varies monotonically with depth in said third layer.

55. The transistor of claim 53 wherein said gate insulator structure further comprises a fourth layer.

56. The transistor of claim 55 wherein compounds of said fourth layer comprise gallium and oxygen.

57. The transistor of claim 55 wherein a compound of said fourth layer comprise gallium, oxygen, and a rare earth element.

58. The transistor of claim 57 wherein a compound of said fourth layer-further comprises indium.

59. The transistor of claim 49 wherein said first layer is adjacent and in contact with said upper surface.

60. The transistor of claim 49 further comprising ion implanted source and drain contacts.

61. The transistor of claim 60 wherein said source and drain contacts are annealed in an ultra high vacuum environment.

62. The transistor of claim 49 wherein said gate insulator structure passivates said upper surface.

63. A method for forming a metal-oxide-compound semiconductor field effect transistor, comprising:
providing a compound semiconductor wafer structure having an upper surface;
depositing a gate insulator structure comprising depositing a first layer and depositing a second layer, said gate insulator structure on said upper surface;
said first layer substantially comprising compounds of indium and oxygen;
said second layer comprising at least one compound of gallium, oxygen and at least one rare earth element; and
depositing a gate electrode on said gate insulator structure.

64. The method of claim 63 comprising rapid thermal annealing said structure in an ultra high vacuum environment.

65. The method of claim 64 wherein said rapid thermal annealing comprises annealing between 700 and 950 degrees Centigrade.

66. A metal-oxide-compound semiconductor field effect transistor comprising:
a compound semiconductor wafer structure having an upper surface;
a gate insulator structure comprising a first layer and a second layer;
said first layer substantially comprising compounds of indium and oxygen;
said second layer comprising compounds of gallium, sulphur, and at least one rare earth element;
a gate electrode positioned on said gate insulator structure;
source and drain regions self-aligned to said gate electrode; and
source and drain ohmic contacts positioned on ion implanted source and drain areas of said source and drain regions.

67. The transistor of claim 66 wherein said first layer forms an atomically abrupt interface with said upper surface.

68. The transistor of claim 66 wherein said gate insulator structure comprises at least three layers, including a graded layer that contains varying compositions of indium, gallium, oxygen and at least one rare-earth element.

69. The transistor of claim 68 wherein a third layer of said gate insulator structure comprises indium, gallium, and sulphur.

70. The transistor of claim 66 wherein said field effect transistor is an enhancement mode transistor.

71. The transistor of claim 66 wherein said field effect transistor is a depletion mode transistor.

72. The transistor of claim 66 wherein said first layer has a thickness of more than 3 angstroms and less than 25 angstroms.

73. The transistor of claim 66 wherein said gate insulator structure has a thickness of 20–300 angstroms.

74. The transistor of claim 66 wherein said first layer forms an interface with said upper surface that extends less than four atomic layers.

75. The transistor of claim 66 wherein said first layer and said gate insulator structure protects said upper surface.

76. The transistor of claim 66 wherein said gate electrode comprises a refractory metal which is stable in the presence of said gate insulator structure at 700 Centigrade.

77. The transistor of claim 66 wherein said source and drain regions are ion implanted to provide for at least one of an n-type and a p-type region.

78. The transistor of claim 66 wherein said source and drain regions provide at least one of an n-channel and a p-channel.

79. The transistor of claim 66 wherein implants in said source and drain regions comprise at least one of Be, Si, Te, Sn, C, and Mg.

80. The transistor of claim 66 wherein said upper surface comprises GaAs.

81. The transistor of claim 66 wherein said upper surface comprises $In_xGa_{1-x}As$.

82. The transistor of claim 66 wherein said upper surface comprises $Al_xGa_{1-x}As$.

83. The transistor of claim 66 wherein said upper surface comprises GaN.

84. The transistor of claim 66 wherein said upper surface comprises $In_xGa_{1-x}N$.

85. The transistor of claim 66 wherein said upper surface comprises $Al_xGa_{1-x}N$.

86. The transistor of claim 66 wherein said upper surface comprises $In_zGa_{1-z}Sb$.

87. The transistor of claim 66 wherein said upper surface comprises InP.

88. The transistor of claim 66 wherein said gate electrode comprises a metal selected from the group consisting of Pt, Ir, W, WN, TiWN, WSi and combinations thereof.

89. A metal-oxide-compound semiconductor field effect transistor comprising:
a compound semiconductor wafer structure having an upper surface;
a gate insulator structure on said upper surface, said gate insulator structure comprising a first layer, a second layer, and a third layer;
said first layer substantially comprising compounds of indium and oxygen;
said first layer in contact with said upper surface;
said second layer comprising compounds of indium, gallium, at least one of oxygen and sulphur, and at least one rare earth element;
said second layer above said first layer;
said third layer above said second layer, said third layer substantially comprising gallium, sulphur, and at least one rare earth element, said third layer being insulating;

a gate electrode positioned on said gate insulator structure;

source and drain regions self-aligned to said gate electrode; and source and drain ohmic contacts positioned on ion implanted source and drain areas of said source and drain regions.

90. The transistor of claim 89 wherein said first layer forms an atomically abrupt interface with said upper surface.

91. The transistor of claim 89 wherein said gate insulator structure includes a graded layer that contains varying compositions of indium, gallium, sulphur and at least one rare-earth element.

92. The transistor of claim 89 wherein said third layer comprises indium.

93. The transistor of claim 89 wherein said field effect transistor is an enhancement mode transistor.

94. The transistor of claim 89 wherein said field effect transistor is a depletion mode transistor.

95. The transistor of claim 89 wherein said first layer has a thickness of more than 3 angstroms and less than 25 angstroms.

96. The transistor of claim 89 wherein said gate insulator structure has a thickness of 20–300 angstroms.

97. The transistor of claim 89 wherein said first layer forms an interface with said upper surface that extends less than four atomic layers.

98. The transistor of claim 89 wherein said first layer and said gate insulator structure protects said upper surface.

99. The transistor of claim 89 wherein said gate electrode comprises a refractory metal which is stable in the presence of said gate insulator structure at 700° C.

100. The transistor of claim 89 wherein said source and drain regions are ion implanted to provide for at least one of an n-type and a p-type region.

101. The transistor of claim 89 wherein said source and drain regions provide at least one of an n-channel and a p-channel.

102. The transistor of claim 89 wherein implants in said source and drain regions comprise at least one of Be, Si, Te, Sn, C, and Mg.

103. The transistor of claim 89 wherein said upper surface comprises GaAs.

104. The transistor of claim 89 wherein said upper surface comprises $In_xGa_{1-x}As$.

105. The transistor of claim 89 wherein said upper surface comprises $Al_xGa_{1-x}As$.

106. The transistor of claim 89 wherein said upper surface comprises GaN.

107. The transistor of claim 89 wherein said upper surface comprises $In_xGa_{1-x}N$.

108. The transistor of claim 89 wherein said upper surface comprises $Al_xGa_{1-x}N$.

109. The transistor of claim 89 wherein said upper surface comprises $In_zGa_{1-z}Sb$.

110. The transistor of claim 90 wherein said upper surface comprises InP.

111. A metal-oxide-compound semiconductor field effect transistor comprising:

a compound semiconductor wafer structure having an upper surface;

a multilayer gate insulator structure on said upper surface, said multilayer gate insulator structure comprising a sequence of layers of compositions alternating between a first composition comprising indium, gallium, at least one of oxygen and sulphur, and at least one rare earth element and a second composition comprising indium, gallium, at least one of oxygen and sulphur, and at least one rare earth element;

a gate electrode positioned on said gate insulator structure;

source and drain regions self-aligned to said gate electrode; and source and drain ohmic contacts positioned on ion implanted source and drain areas of said source and drain regions.

112. The transistor of claim 111 wherein said gate electrode comprises a metal selected from the group consisting of Pt, Ti, W, WN, TiWN, WSi and combinations thereof.

113. A metal-oxide-sulphide-compound semiconductor field effect transistor comprising:

a compound semiconductor wafer structure having an upper surface;

a gate insulator structure positioned on said upper surface;

a gate electrode positioned on said gate insulator structure;

source and drain regions self-aligned to said gate electrode; and source and drain ohmic contacts positioned on ion implanted source and drain areas of said source and drain regions;

wherein said compound semiconductor structure comprises a layer formed from one of, $Al_xGa_{1-x}$ As, $In_yGa_{1-y}$ As, $Al_yIn_{1-y}As$, $In_zGa_{1-z}P$, $Al_xGa_{1-x}N$, $In_yGa_{1-y}N$ and GaN, said one of, $Al_xGa_{1-x}As$, $In_yGa_{1-y}As$, $Al_yIn_{1-y}As$, $In_zGa_{1-z}P$, $Al_xGa_{1-x}N$, $In_yGa_{1-y}N$ and GaN on said upper surface;

a substrate on which resides said compound semiconductor wafer structure; and wherein said substrate includes an InP or GaN based semiconductor wafer.

114. A complementary metal-oxide-sulphide compound semiconductor integrated circuit comprising an enhancement mode metal-oxide-compound semiconductor field effect transistor, said transistor comprising;

a compound semiconductor wafer structure having an upper surface;

a gate insulator structure positioned on said upper surface;

a gate electrode positioned on said gate insulator structure;

source and drain regions self-aligned to said gate electrode; and source and drain ohmic contacts positioned on areas of said source and drain regions;

wherein said compound semiconductor wafer structure comprises a wider band gap spacer layer and a narrower band gap channel layer; and wherein said narrower band gap channel layer comprises $In_yGa_{1-y}As$.

115. A metal-oxide-sulphide-compound semiconductor field effect transistor comprising:

a compound semiconductor wafer structure having an upper surface;

a gate insulator structure comprising a first layer and a second layer;

said gate insulator structure on said upper surface;

said first layer substantially comprising compounds of indium and oxygen;

said second layer comprising compounds of gallium, oxygen, and at least one rare earth element; and a gate electrode positioned on said gate insulator structure.

116. The transistor of claim 115 wherein said gate electrode comprises a refractory metal.

117. The transistor of claim 116 wherein said refractory metal comprises a member of the group Pt, Ir, W, WN, TiWN, WSi, and combinations thereof.

118. The transistor of claim 115 wherein said gate insulator structure further comprises a third layer.

119. The transistor of claim 118 wherein compounds of said third layer comprise, gallium, oxygen, and a rare earth element.

120. The transistor of claim 118 wherein a composition of said third layer varies monotonically with depth in said third layer.

121. The transistor of claim 120 wherein said gate insulator structure further comprises a fourth layer.

122. The transistor of claim 121 wherein compounds of said fourth layer comprising gallium and oxygen.

123. The transistor of claim 121 wherein compounds of said fourth layer comprise gallium, oxygen, and a rare earth element.

124. The transistor of claim 123 wherein compounds of said fourth layer further comprise indium.

125. The transistor of claim 115 wherein said first layer is adjacent and in contact with said upper surface.

126. The transistor of claim 115 further comprising ion implanted source and drain contacts.

127. The transistor of claim 126 wherein said ion implanted source and drain contacts are annealed in an ultra high vacuum environment.

128. The transistor of claim 115 wherein said gate insulator structure passivates said upper surface.

129. A method of making a metal-oxide-compound semiconductor field effect transistor comprising:
providing a compound semiconductor wafer structure having an upper surface;
providing a gate insulator structure comprising a first layer and a second layer;
said first layer substantially comprising compounds of indium and oxygen;
said second layer comprising compounds of gallium, oxygen, and at least one rare earth element;
providing a gate electrode positioned on said gate insulator structure; and
providing source and drain regions self-aligned to said gate electrode;
providing ohmic contacts on said source and drain regions.

130. A method of using a metal-oxide-compound semiconductor field effect transistor comprising a compound semiconductor wafer structure having an upper surface;
a gate insulator structure on said upper surface, said gate insulator comprising a first layer and a second layer;
said first layer substantially comprising compounds of indium and oxygen;
said second layer comprising compounds of gallium, oxygen, and at least one rare earth element;
a gate electrode positioned on said gate insulator structure;
source and drain regions self-aligned to said gate electrode; and
source and drain ohmic contacts positioned on said source and drain regions:
said method comprising the step of applying a voltage to said gate electrode.

131. A metal-oxide-compound semiconductor field effect transistor comprising:
a compound semiconductor wafer structure having an upper surface;
a gate insulator structure comprising a first layer and a second layer;
said gate insulator structure on said upper surface;
said first layer substantially comprising at least one compound including at least indium and at least one of oxygen and sulphur;
said second layer comprising at least one of:
(1) a compound of gallium, oxygen, and at least one rare earth element;
(2) a compound of indium, gallium, oxygen, and at least one rare earth element;
(3) a compound of gallium, sulphur, and at least one rare earth element;
(4) a compound of indium, gallium, oxygen, and sulphur and at least one rare earth element; and
(5) indium, gallium, oxygen or sulphur, and at least one rare earth element; and
a gate electrode positioned on said gate insulator structure.

132. The transistor of claim 131 wherein said compound semiconductor wafer structure comprises a substrate comprising one of an InP and a GaN, and said substrate has an upper surface.

133. The transistor of claim 132 wherein said compound semiconductor wafer structure comprises a semiconductor layer positioned on said upper surface of said substrate, said semiconductor layer comprising one of AlxGa1−xAs, InyGa1−yAs, AlvIn1−vAs, InzGa1−zP, AlxGa1−xN, InyGa1−yN and GaN.

134. The transistor of claim 131 wherein said compound semiconductor wafer structure comprises a wider band gap spacer layer and a narrower band gap channel layer, and wherein said narrower band gap channel layer comprises $In_yGa_{1-y}As$.

135. A method of making a metal-oxide-compound semiconductor field effect transistor, said transistor comprising:
providing a compound semiconductor wafer structure having an upper surface;
providing a gate insulator structure comprising a first layer and a second layer;
said gate insulator structure on said upper surface;
said first layer substantially comprising at least one compound including at least indium and oxygen or sulphur;
said second layer comprising at least one of:
(1) a compound of gallium, oxygen, and at least one rare earth element;
(2) a compound of indium, gallium, oxygen, and at least one rare earth element;
(3) a compound of gallium, sulphur, and at least one rare earth element;
(4) a compound of indium, gallium, oxygen, and sulphur and at least one rare earth element; and
(5) indium, gallium, oxygen or sulphur, and at least one rare earth element; and providing a gate electrode positioned on said gate insulator structure.

136. A method of using a metal-oxide-compound semiconductor field effect transistor, said transistor comprising:
a compound semiconductor wafer structure having an upper surface;
a gate insulator structure comprising a first layer and a second layer;
said gate insulator structure on said upper surface;
said first layer substantially comprising at least one compound including at least indium and at least one of oxygen and sulphur;

said second layer comprising at least one of:
(1) a compound of gallium, oxygen, and at least one rare earth element;
(2) a compound of indium, gallium, oxygen, and at least one rare earth element;
(3) a compound of gallium, sulphur, and at least one rare earth element;
(4) a compound of indium, gallium, oxygen, and sulphur and at least one rare earth element; and
(5) a compound of indium, gallium, at least one of oxygen and sulphur, and at least one rare earth element;
a gate electrode positioned on said gate insulator structure; and
said method comprising applying a voltage to said gate electrode.

137. A metal-oxide-compound semiconductor field effect transistor comprising:
a compound semiconductor wafer structure having an upper surface;
a gate insulator structure comprising a first layer and a second layer;
said gate insulator structure on said upper surface;
said first layer substantially comprising at least one compound including at least indium and at least one of oxygen and sulphur;
said second layer comprising at least a substantial amount of elements of (1) gallium or indium, (2) oxygen or sulphur, and (3) a rare earth element; and
a gate electrode positioned on said gate insulator structure.

138. A complementary metal-oxide compound semiconductor integrated circuit comprising an enhancement mode metal-oxide-compound semiconductor field effect transistor, said transistor comprising;
a compound semiconductor wafer structure having an upper surface;
a multi layer gate insulator structure positioned on said upper surface;
a gate electrode positioned on said gate insulator structure, such that a portion of said gate electrode is over portions of at least two layers of said multi layer gate insulator structure;
source and drain regions self-aligned to the gate electrode; and
source and drain ohmic contacts positioned on source and drain areas of said source and drain regions;
wherein said compound semiconductor wafer structure comprises a wider band gap spacer layer and a narrower band gap channel layer;
wherein said narrower band gap channel layer comprises $In_yGa_{1-y}As$; and
wherein said multi layer gate insulator structure comprises substantial amounts of a sulfide.

139. A complementary metal-oxide compound semiconductor integrated circuit comprising an enhancement mode metal-oxide-compound semiconductor field effect transistor, said transistor comprising;
a compound semiconductor wafer structure having an upper surface;
a multi layer gate insulator structure positioned on said upper surface;
a gate electrode positioned on said gate insulator structure, such that a portion of said gate electrode is over portions of at least two layers of said multi layer gate insulator structure;
source and drain regions self-aligned to the gate electrode; and
source and drain ohmic contacts positioned on source and drain areas of said source and drain regions;
wherein said compound semiconductor wafer structure comprises a wider band gap spacer layer and a narrower band gap channel layer;
wherein said narrower band gap channel layer comprises $In_yGa_{1-y}As$; and
wherein said multi layer gate insulator structure comprises substantial amounts of a rare earth element.

* * * * *